(12) United States Patent
Greene et al.

(10) Patent No.: US 12,417,944 B2
(45) Date of Patent: Sep. 16, 2025

(54) FORMATION OF TRENCH SILICIDE SOURCE OR DRAIN CONTACTS WITHOUT GATE DAMAGE

(71) Applicant: International Business Machines Corporation, Armonk, NY (US)

(72) Inventors: Andrew Greene, Albany, NY (US); Ruilong Xie, Schenectady, NY (US); Laertis Economikos, Wappingers Falls, NY (US); Veeraraghavan S. Basker, Schenectady, NY (US); Chanro Park, Clifton Park, NY (US); Hui Zang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 17/817,365

(22) Filed: Aug. 4, 2022

(65) Prior Publication Data
US 2022/0375788 A1 Nov. 24, 2022

Related U.S. Application Data

(62) Division of application No. 16/183,785, filed on Nov. 8, 2018, now Pat. No. 11,443,982.

(51) Int. Cl.
*H01L 21/768* (2006.01)
*H10D 30/01* (2025.01)
(Continued)

(52) U.S. Cl.
CPC ..... *H01L 21/76832* (2013.01); *H10D 30/024* (2025.01); *H10D 30/62* (2025.01);
(Continued)

(58) Field of Classification Search
CPC ......... H01L 29/66545; H01L 29/66606; H01L 29/66871; H01L 29/66583; H01L 29/66575; H01L 29/6656; H01L 29/6653; H01L 29/66553; H01L 21/28132–2815; H01L 21/823468; H01L 21/823864; H01L 29/66689; H01L 29/66719; H01L 29/4983;
(Continued)

(56) References Cited

U.S. PATENT DOCUMENTS 6,429,477 B1 8/2002 Mandelman et al.
9,267,707 B2 2/2016 Koo
(Continued)

OTHER PUBLICATIONS

List of IBM Patents or Patent Applications Treated as Related; Date Filed: Aug. 4, 2022, 2 pages.
(Continued)

*Primary Examiner* — Julio J Maldonado
*Assistant Examiner* — Stanetta D Isaac
(74) *Attorney, Agent, or Firm* — CANTOR COLBURN LLP; L. Jeffrey Kelly

(57) ABSTRACT

A semiconductor device includes one or more fins extending from a substrate, the one or more fins having source/drain epitaxial grown material (S/D epitaxy) thereon that merges one or more fins, a gate formed over the one or more fins, the gate including high k metal gate disposed between gate spacers and a metal liner over the S/D epitaxy and sides of the gate spacers. The gate includes a self-aligned contact cap over the HKMG and the metal liner.

4 Claims, 15 Drawing Sheets

(51) Int. Cl.
*H10D 30/62* (2025.01)
*H10D 64/01* (2025.01)
*H10D 64/66* (2025.01)
*H10D 64/68* (2025.01)
*H10D 84/01* (2025.01)
*H10D 84/03* (2025.01)

(52) U.S. Cl.
CPC ......... *H10D 64/017* (2025.01); *H10D 64/667* (2025.01); *H10D 64/691* (2025.01); *H10D 84/0158* (2025.01); *H10D 84/038* (2025.01)

(58) Field of Classification Search
CPC ........... H01L 29/51–518; H01L 29/435; H01L 29/495–4958; H01L 29/4966–4975; H01L 21/28061; H01L 21/28079–28088; H01L 21/32051–32053; H01L 29/66515; H01L 21/28097; H01L 29/41783; H01L 29/66636; H01L 21/823814; H01L 21/823418; H01L 21/76834; H01L 21/76897; H10D 30/024; H10D 30/62; H10D 62/151; H10D 84/0158; H10D 84/038

See application file for complete search history.

(56) References Cited

U.S. PATENT DOCUMENTS

| | | |
|---|---|---|
| 9,379,025 B1 | 6/2016 | Basker et al. |
| 9,484,348 B2 | 11/2016 | Basker et al. |
| 9,680,020 B2 | 6/2017 | Basker et al. |
| 9,722,043 B2 | 8/2017 | Basker et al. |
| 9,812,365 B1 | 11/2017 | Zhang et al. |
| 9,923,078 B2 | 3/2018 | Greene et al. |
| 2008/0076216 A1 | 3/2008 | Pae et al. |
| 2008/0194068 A1 | 8/2008 | Temmler et al. |
| 2010/0109091 A1 | 5/2010 | Griebenow et al. |
| 2012/0211808 A1 | 8/2012 | Wei et al. |
| 2015/0348903 A1 | 12/2015 | Melzner |
| 2018/0197970 A1 | 7/2018 | Pan et al. |
| 2018/0269297 A1* | 9/2018 | Zhang ............... H01L 21/76889 |
| 2018/0269305 A1 | 9/2018 | Bao et al. |
| 2018/0294340 A1 | 10/2018 | Cheng et al. |
| 2020/0152509 A1 | 5/2020 | Greene et al. |

OTHER PUBLICATIONS

Su Chen Fan et al., "Gas cluster ion beam processing for improved self aligned contact yield at 7 nm node FinFET: MJ: MOL and junction interfaces," 29th Annual Semi Advanced Semiconductor Manufacturing Conference (ASMC), 2018, pp. 208-210.

Greene et al., "Formation of Trench Silicide Source or Drain Contacts Without Gate Damage" U.S. Appl. No. 16/183,785, filed Nov. 8, 2018.

* cited by examiner

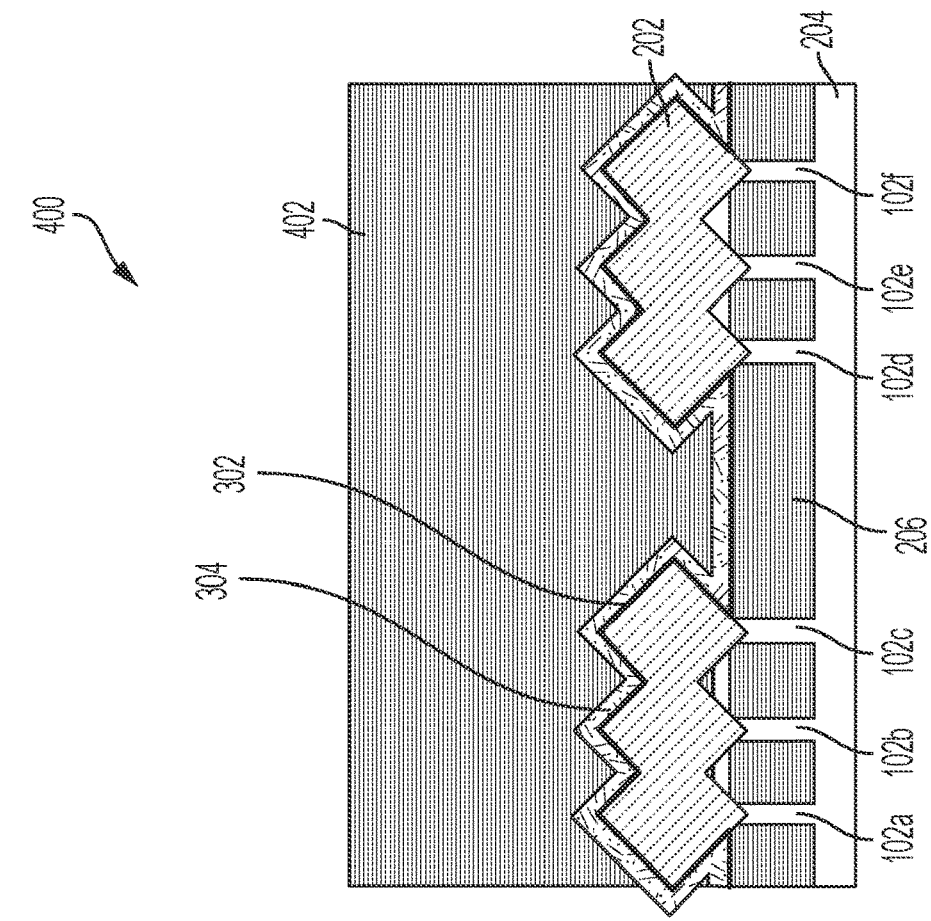
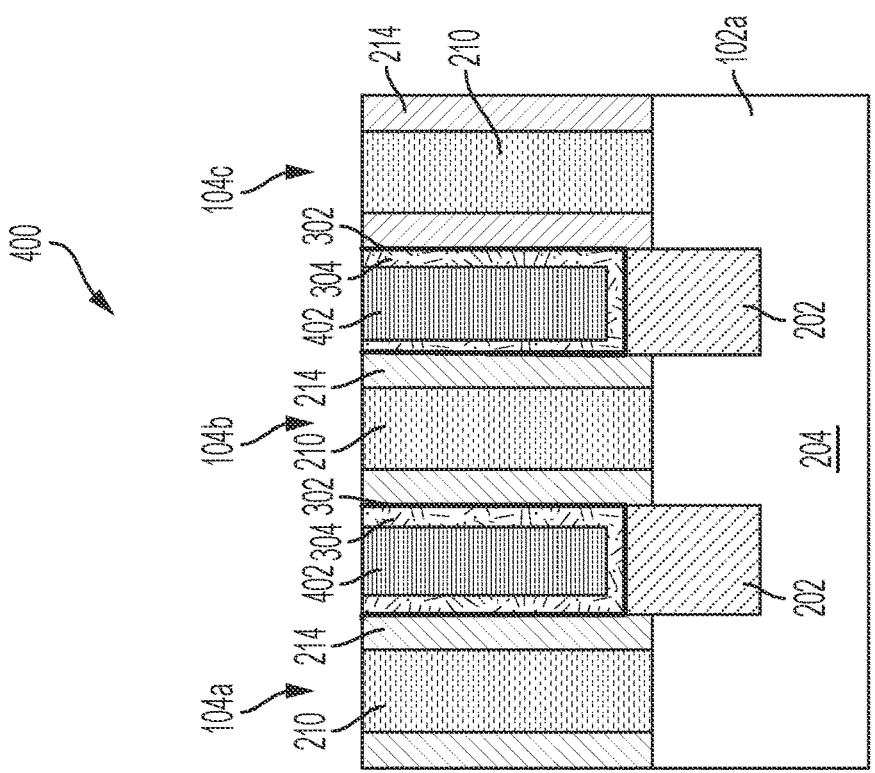
FIG. 4A
FIG. 4B

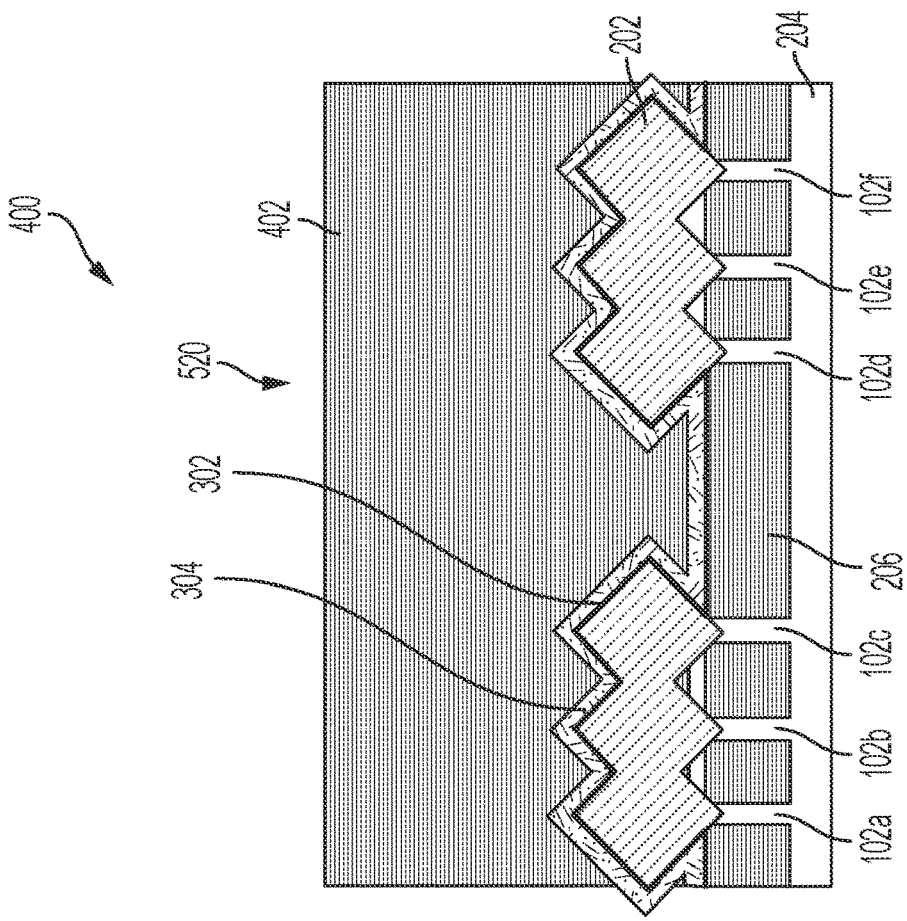
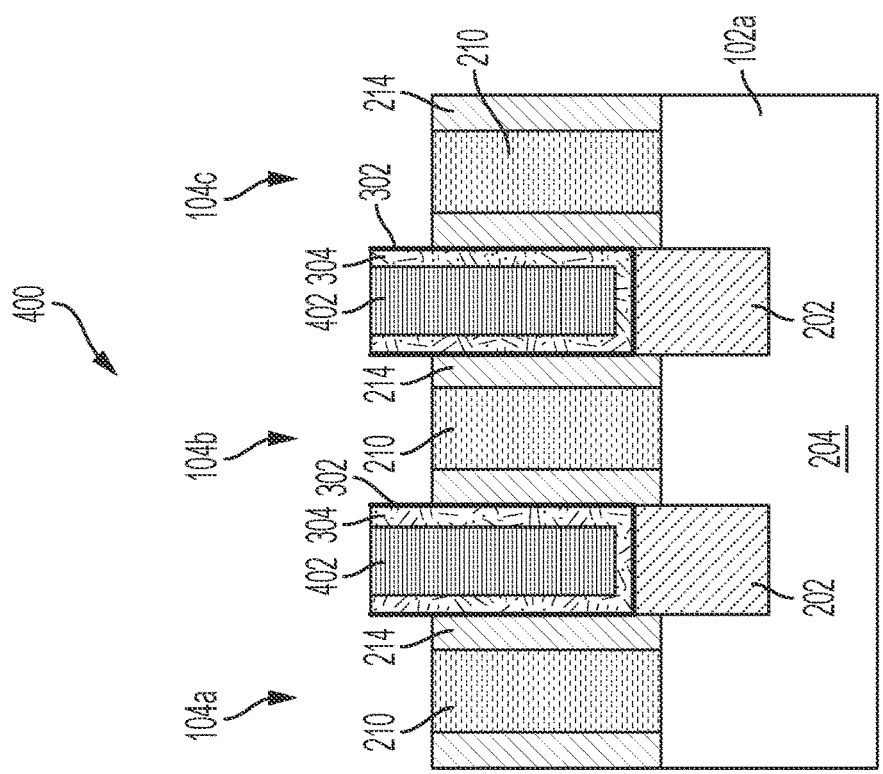
FIG. 5A
FIG. 5B

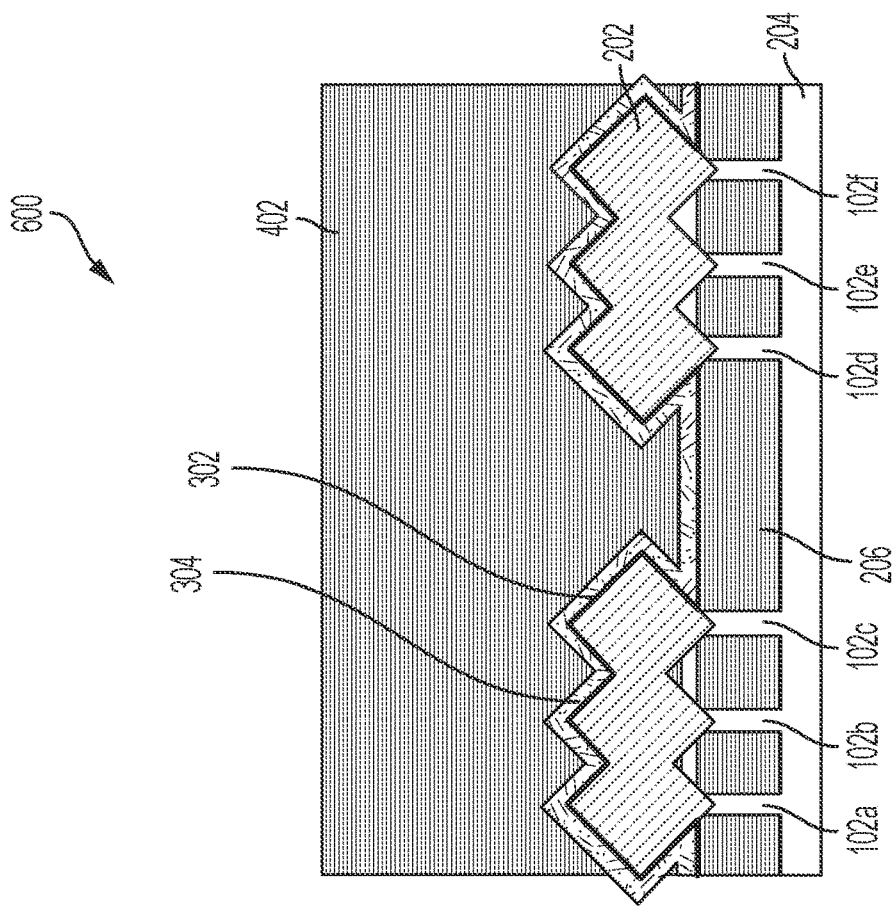
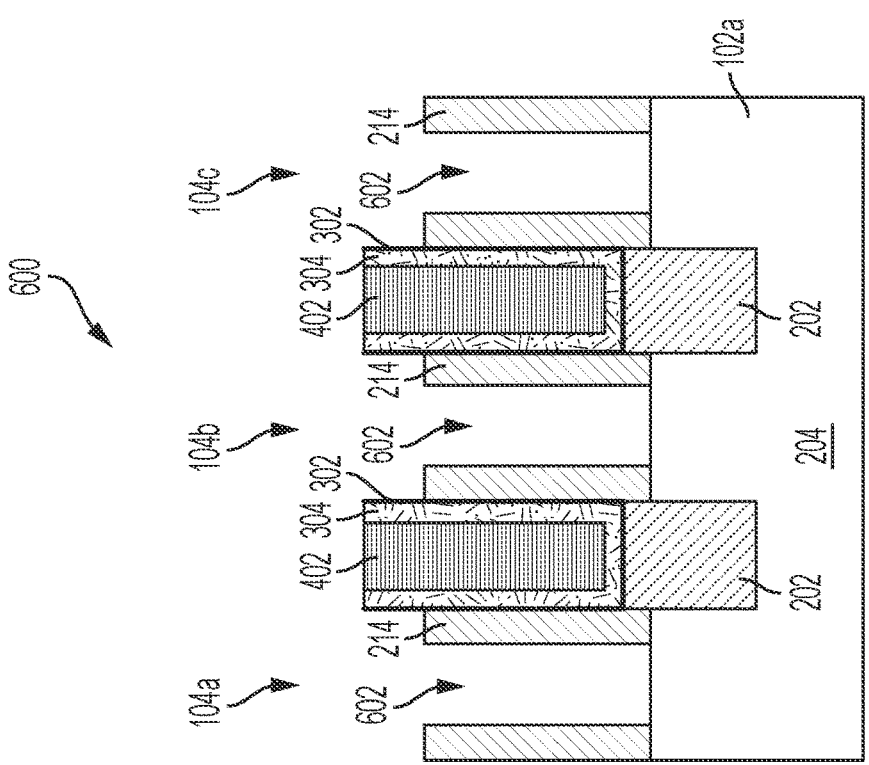

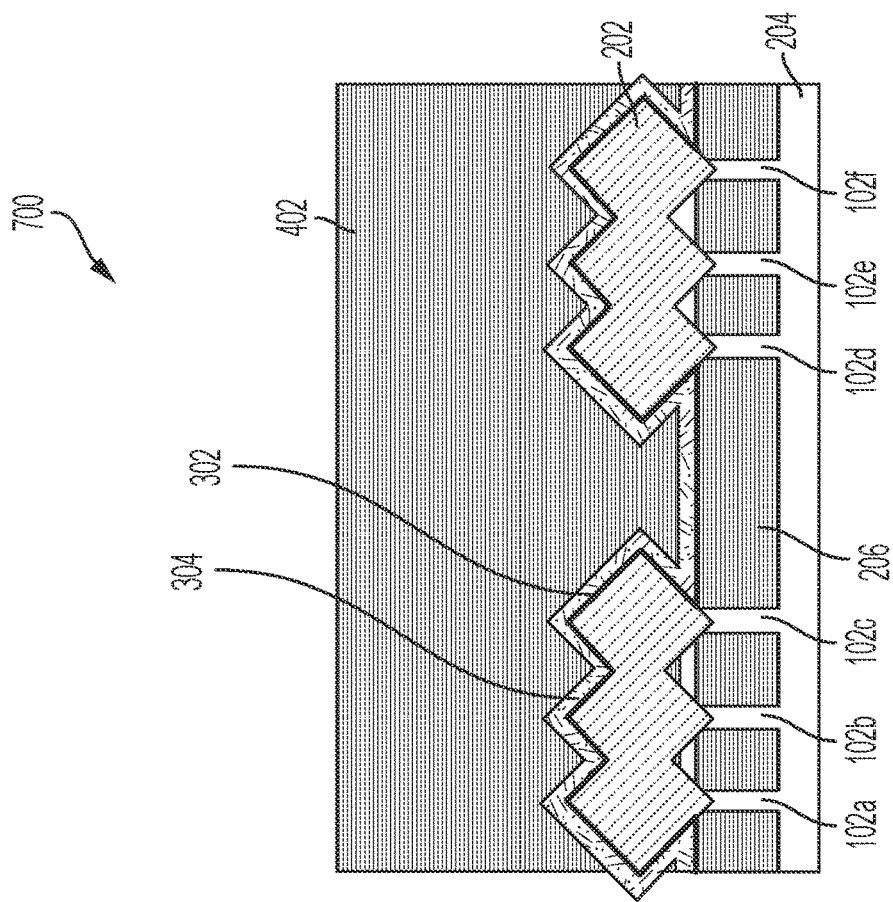
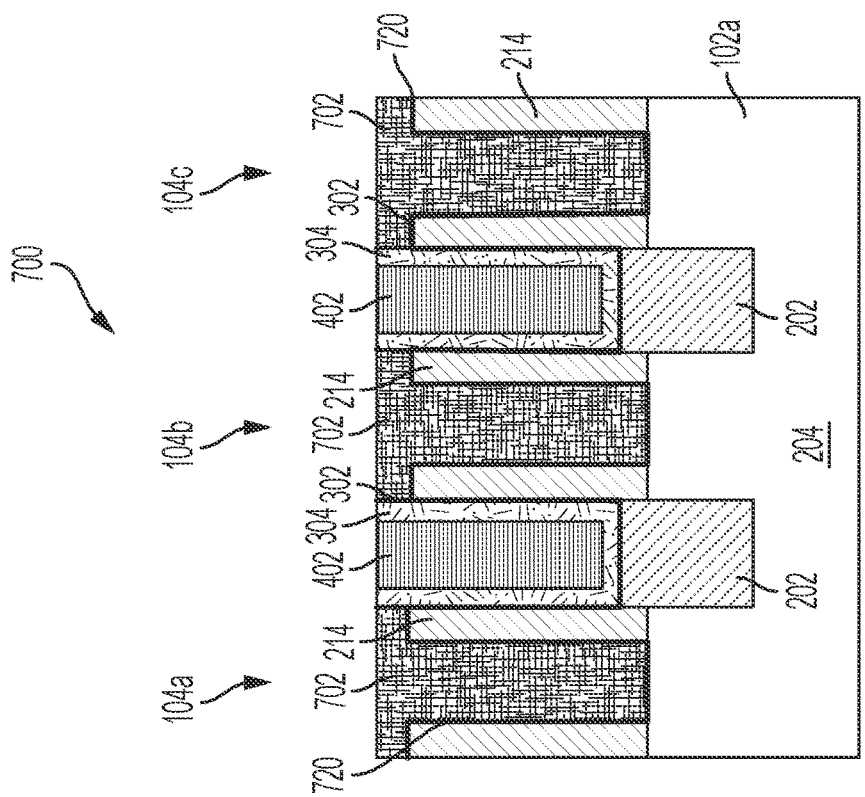
FIG. 7B
FIG. 7A

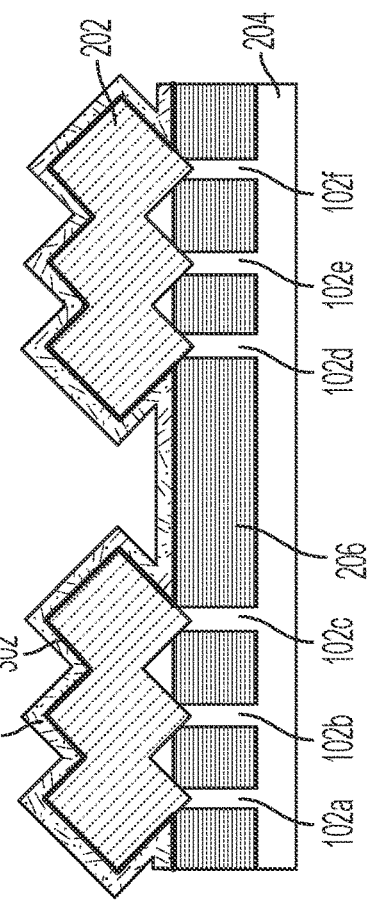
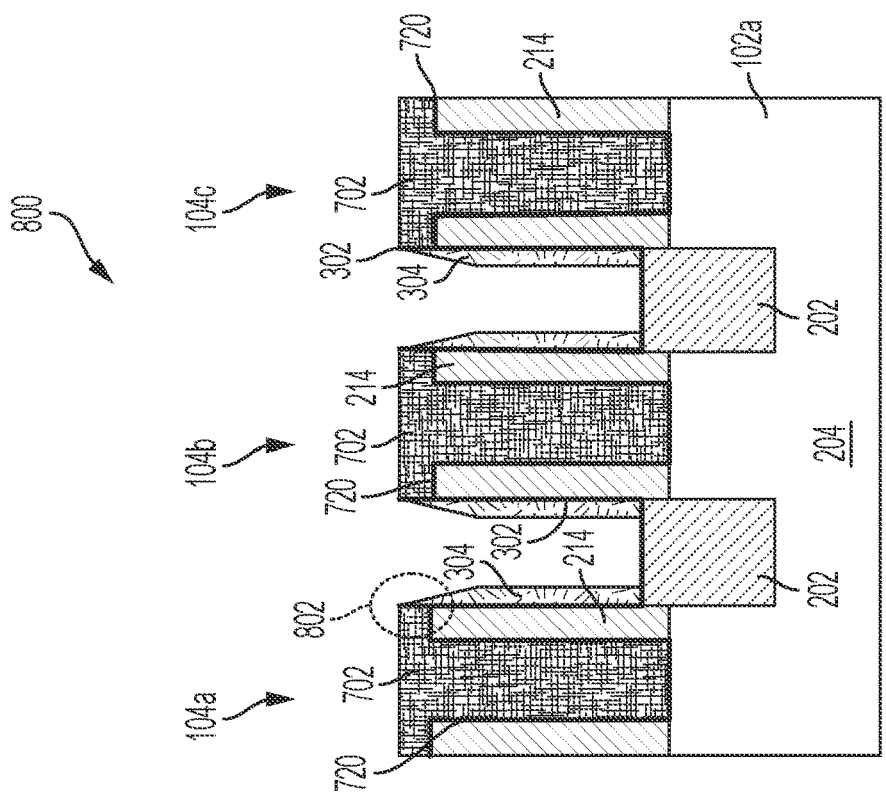
FIG. 8B
FIG. 8A

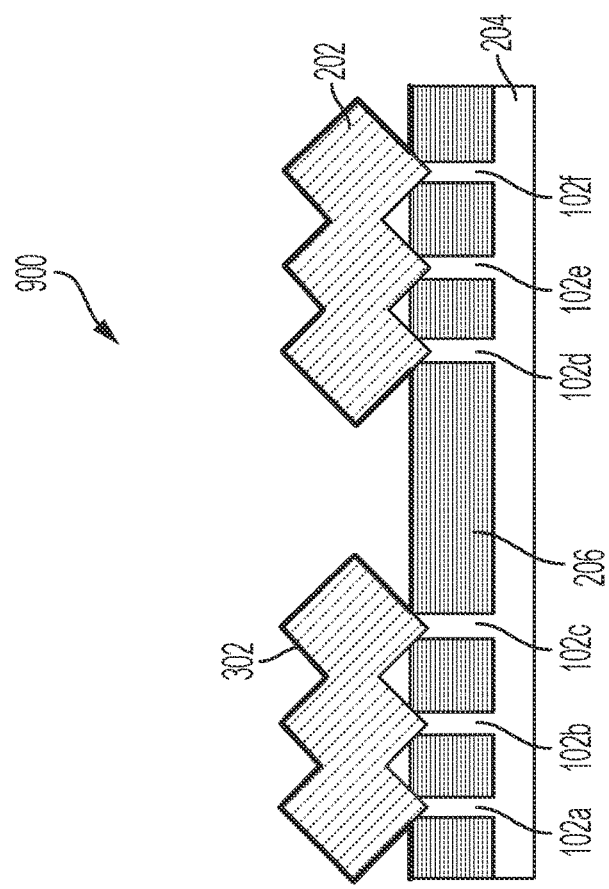
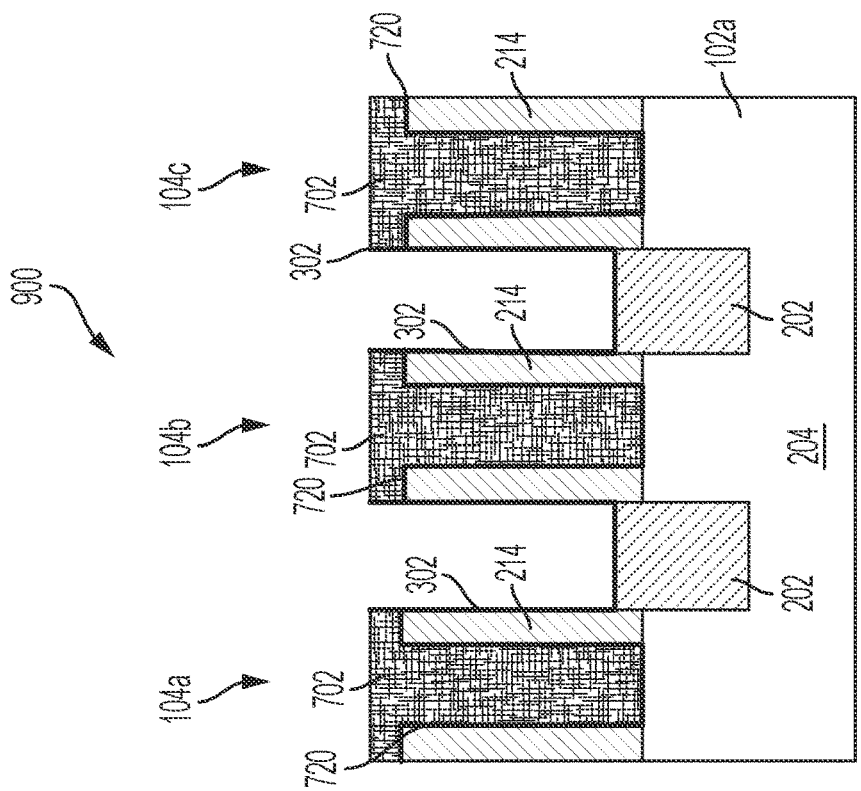
FIG. 9B
FIG. 9A

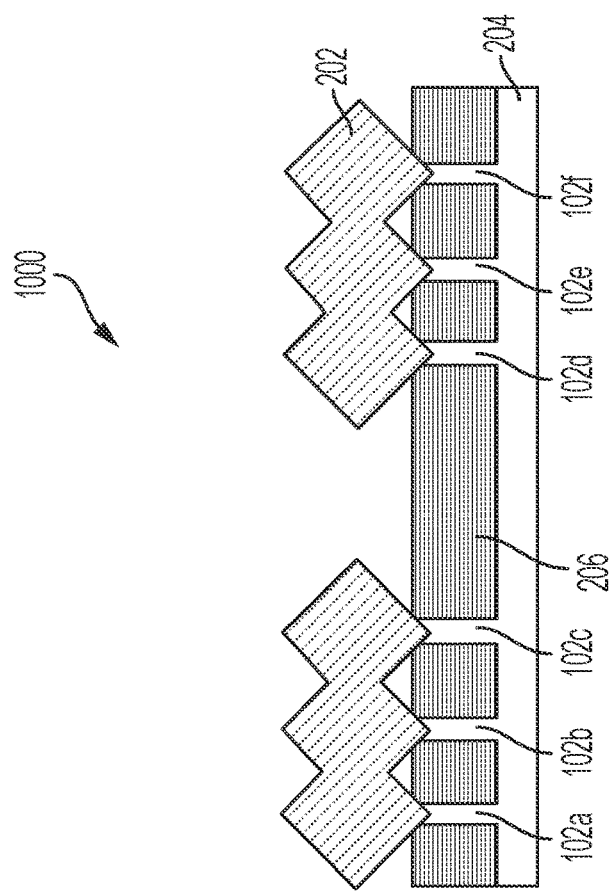
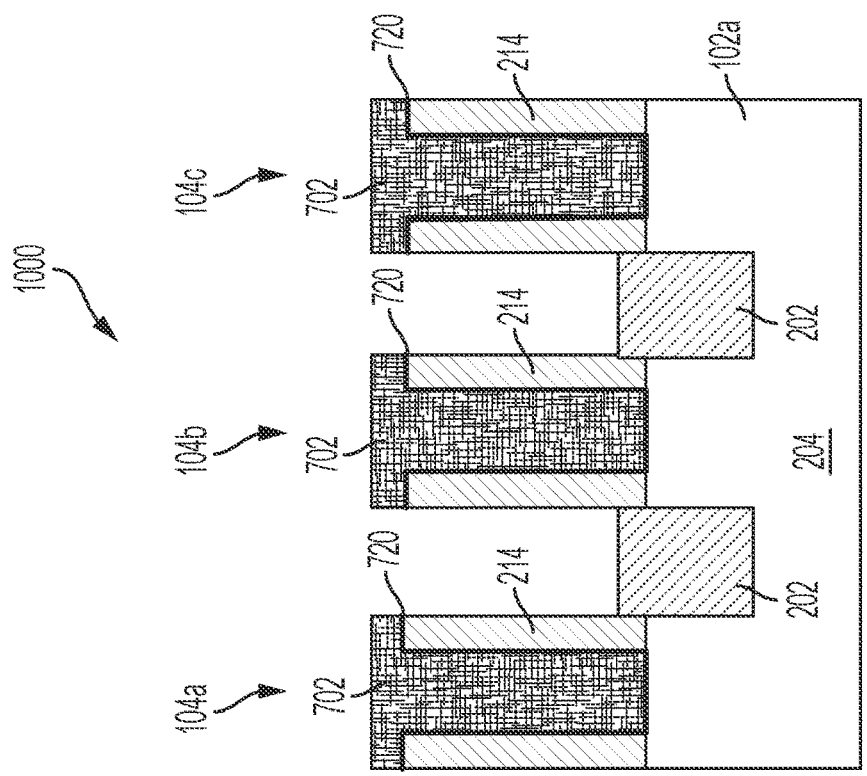
FIG. 10A
FIG. 10B

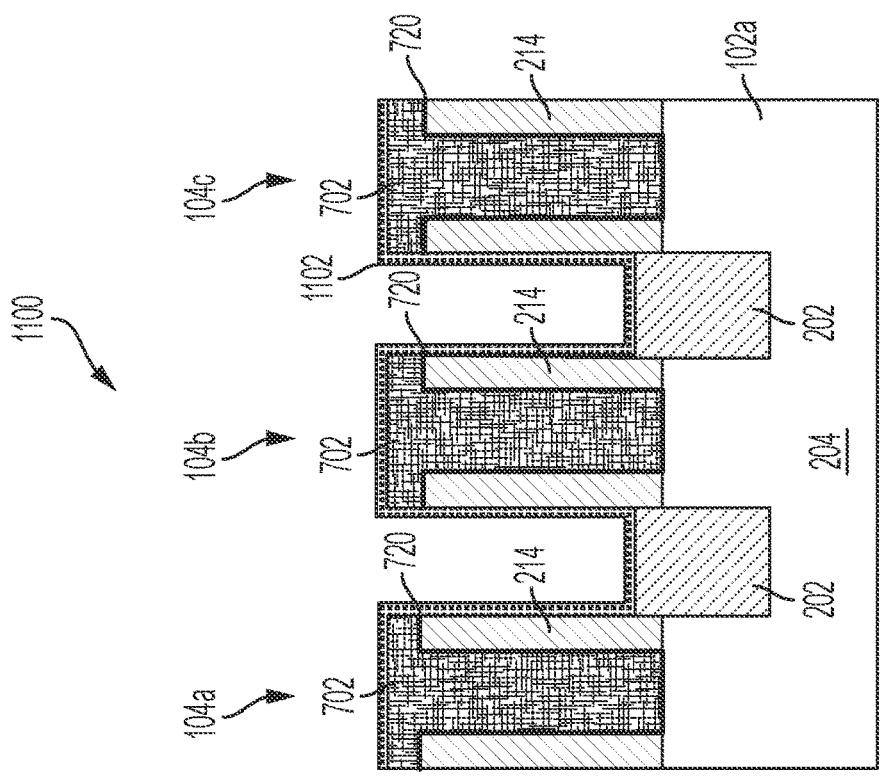
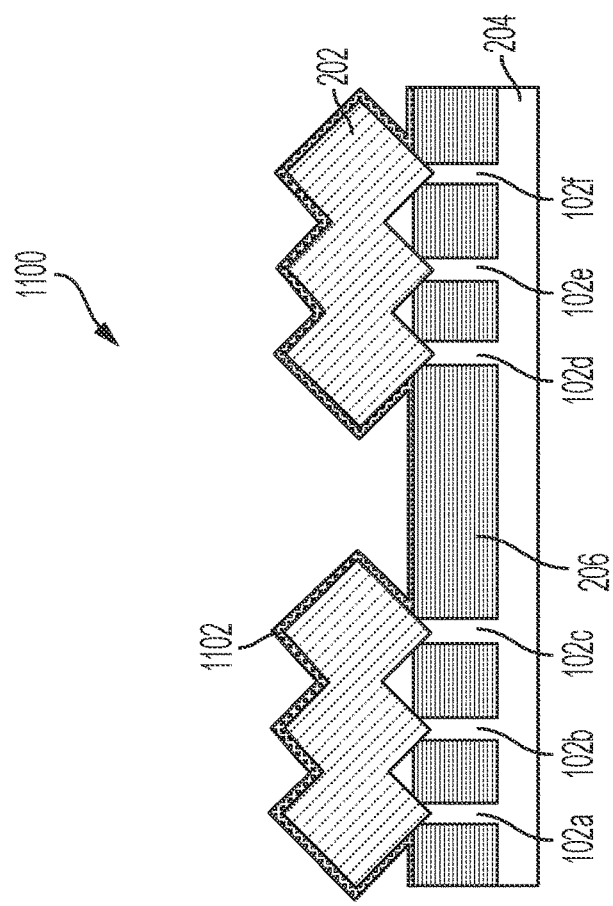
FIG. 11A
FIG. 11B

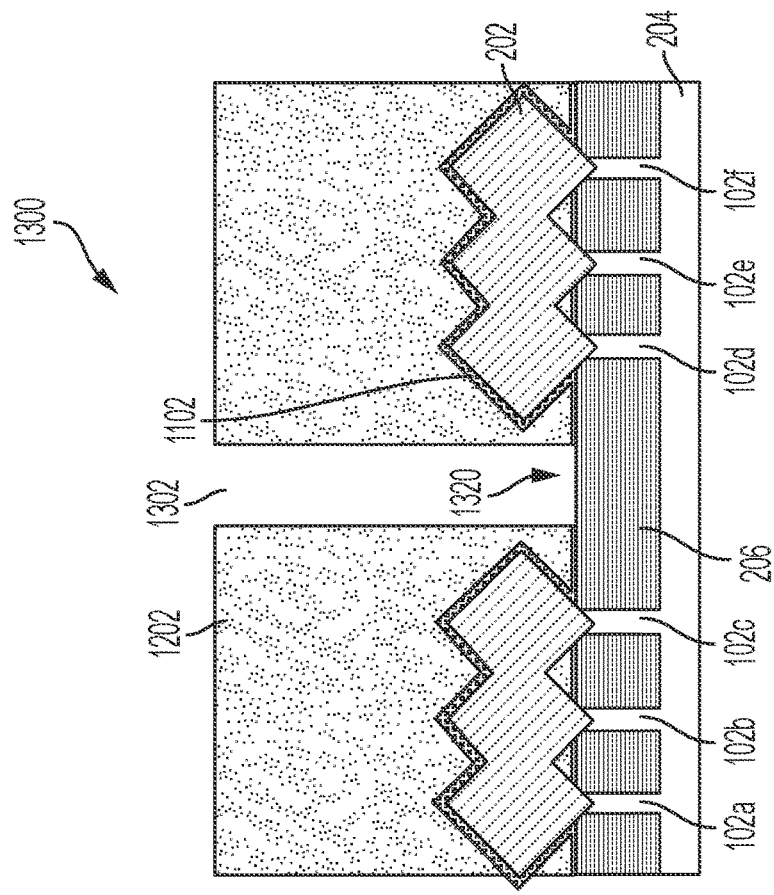
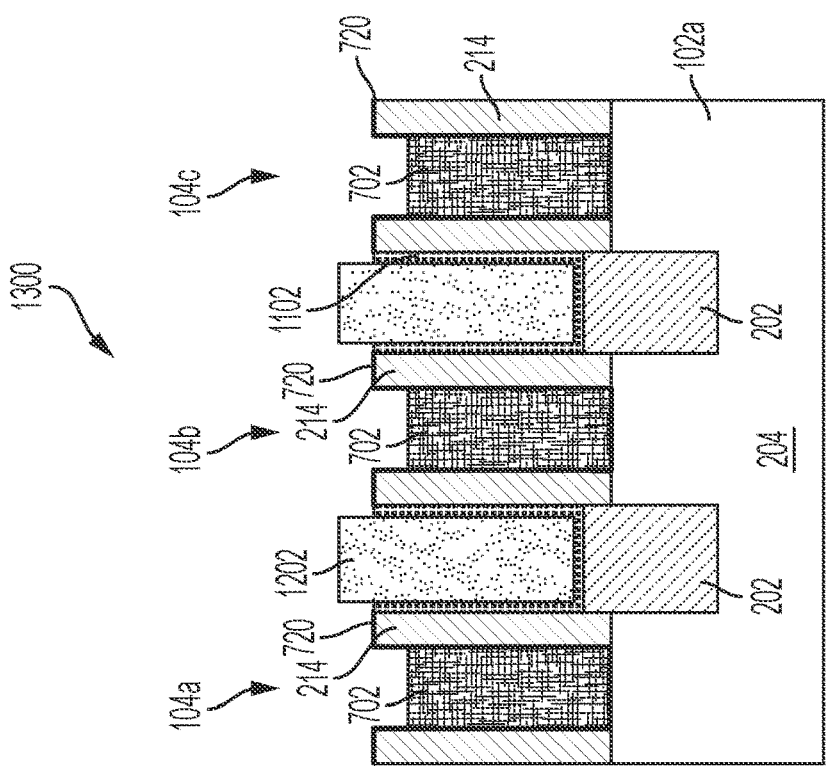
FIG. 13B
FIG. 13A

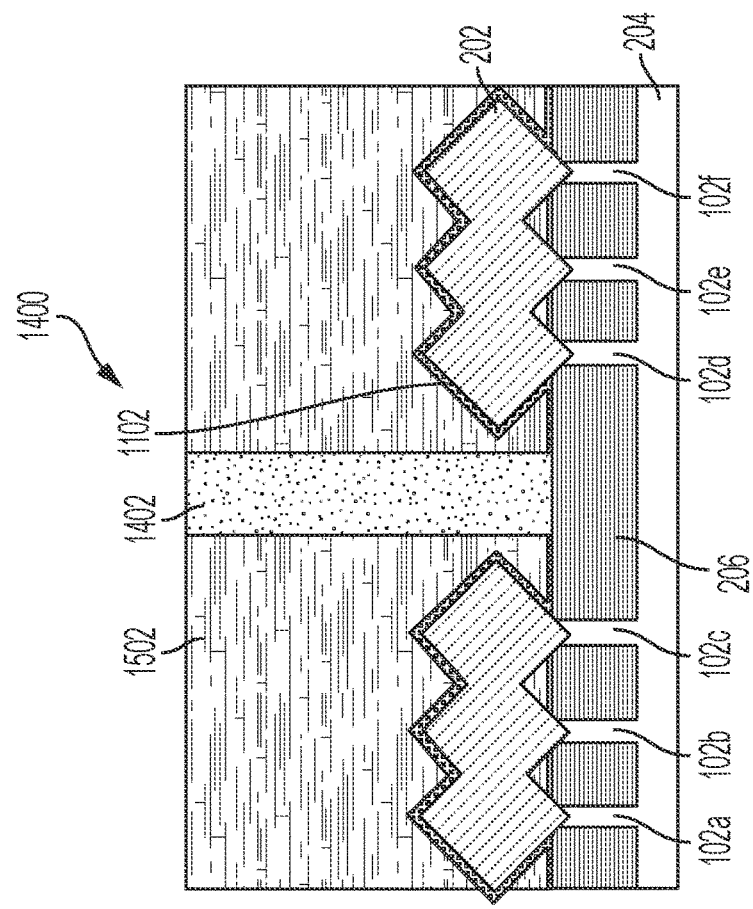
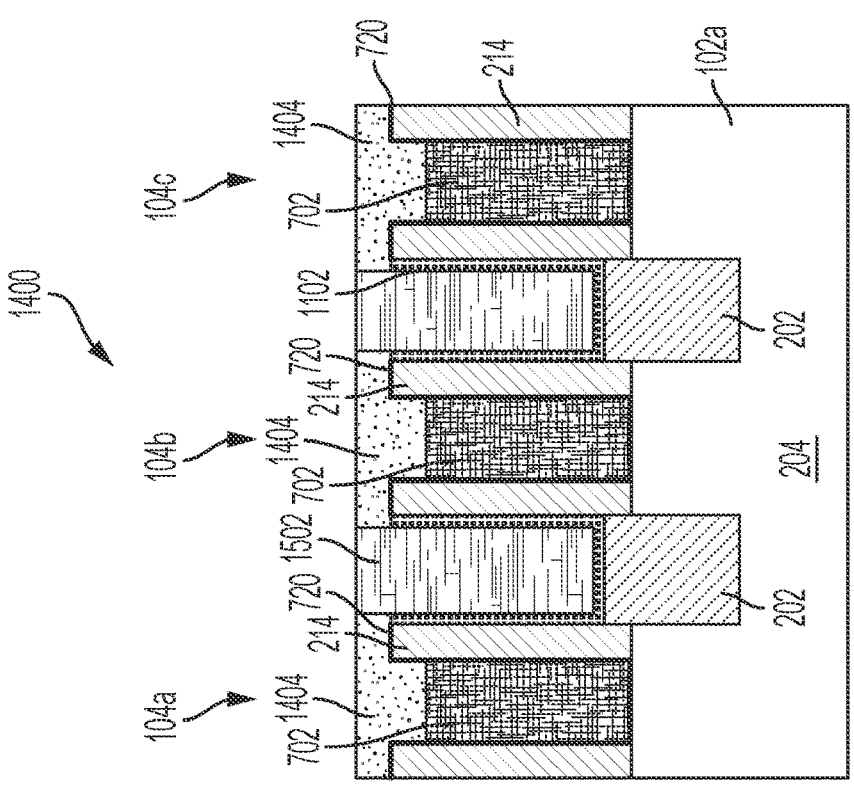
FIG. 15B
FIG. 15A

FORMATION OF TRENCH SILICIDE SOURCE OR DRAIN CONTACTS WITHOUT GATE DAMAGE

BACKGROUND

The present invention generally relates to fabrication methods and resulting structures for semiconductor devices. More specifically, the present invention relates to fabrication methods and resulting structures for transistor devices that utilize a trench silicide cut for drain contacts that does not cause gate damage.

In contemporary semiconductor device fabrication processes, a large number of semiconductor devices, such as fin field effect transistors (finFETs), are fabricated on a single wafer. FinFETs employ semiconductor fins to introduce on-wafer topography. Typical FinFET production includes forming fins from a substrate. The substrate can be monocrystalline silicon, although other suitable substrate materials may be employed.

One or more dummy gates are formed over the fins, and the portion of the fin that is under the gate functions as the transistor's channel. The source region and the drain region are the portions of the fin that are not under the gate and are on opposite sides on the channel. The dummy gate can include a spacer provided on the sides of the dummy gate. So-called "raised source or drain" (RSD) regions are formed by epitaxially growing the RSD regions over the source and drain regions of the fins. The RSD regions provide additional surface areas for contacting the source or drain (S/D) regions. Typically, the S/D (or epi) regions are then covered with an interlayer dielectric (ILD) and gate processing then progresses.

SUMMARY

Embodiments of the present invention are directed to a method for fabricating a semiconductor device. One method includes: receiving a structure that includes a fin extending from a substrate and covered by a dummy gate, the dummy gate including a sacrificial gate material covered by a hardmask material and having sides covered by a gate spacer, the fin including an exposed region not covered by the dummy gate and having an epitaxially grown material (S/D epitaxy) thereon; forming an etch stop liner over the dummy gate and the S/D epitaxy; forming an etch stop layer over the etch stop liner; forming an interlayer dielectric layer (ILD) over the etch stop layer; removing the hardmask material to expose the sacrificial gate material; partially removing the gate spacer and the sacrificial gate material to a level below a top of the ILD layer; removing the sacrificial gate material to form a gate recess within the gate spacer; forming a high-k metal gate (HKMG) in the gate trench by depositing a high-k dielectric layer and forming a metal gate over the high-k dielectric layer; removing the ILD layer to expose the etch stop layer, wherein the etch stop layer and the etch stop liner protects the gate spacer from being removed during removal of the ILD; removing the contact etch stop layer, wherein the etch stop liner protects the gate spacer from being removed during removal of the contact etch stop layer; removing exposed portions of the etch stop liner; depositing a metal liner over the S/D epitaxy and the HKMG; depositing an organic planarization layer (OPL) over the S/D epitaxy and the HKMG and planarizing the OPL to expose the metal liner over the HKMG; removing portions of the OPL to form a contact metal liner cut pattern opening through the OPL that exposes the metal liner over the ILD next to the fin; etching the metal liner to expose the ILD next the fin and to expose the HKMG; filling the contact metal liner cut pattern opening with a source drain spacer and forming a self-aligned contact (SAC) cap over the HKMG; removing exposed OPL; and forming metal S/D contacts over the fin.

One embodiment is directed to method of fabricating at least two multi-fin finFETs. The method includes: receiving a structure that includes a plurality of fins extending from a substrate and covered by a dummy gate, the fins including a first group of fins separated from a second group of fins, the fins including an exposed region not covered by the dummy gate and having an epitaxially grown material (S/D epitaxy) thereon, the dummy gate including a sacrificial gate material covered by a hardmask material and having sides covered by a gate spacer; forming an etch stop liner over the dummy gate and the first and second groups of fins; forming a etch stop layer over the etch stop liner; forming an interlayer dielectric layer (ILD) over the contact etch stop layer; removing the hardmask material and exposing the sacrificial gate material; partially removing the gate spacer and the sacrificial gate material to a level below a top of the ILD layer; removing the sacrificial gate material to form a gate recess within the gate spacer; forming a high k metal gate (HKMG) in the gate recess by depositing a high-k dielectric layer and forming a metal gate over the high-k dielectric layer; removing the ILD layer to expose the contact etch stop layer, wherein the etch stop layer and the etch stop liner protects the gate spacer from being removed during removal of the ILD; removing the contact etch stop layer, wherein the etch stop liner protects the gate space from being removed during removal of the contact etch stop layer; removing exposed portions of the etch stop liner; depositing a metal liner over the S/D epitaxy and the HKMG; depositing an organic planarization layer (OPL) over the S/D epitaxy and the HKMG and planarizing the OPL to expose the metal liner over the HKMG; removing portions of the OPL to form a contact metal liner cut pattern opening through the OPL that exposes the metal liner over the ILD next to the fins; etching the metal liner exposed by the contact metal liner cut pattern opening to expose the ILD to separate the first and second groups of fins and to expose the HKMG; filling the contact metal liner cut pattern opening with a source/drain spacer and forming a self-aligned contact cap over the HKMG; removing exposed OPL; and forming metal S/D contacts over the first and second groups of fins.

In one embodiment a semiconductor device is disclosed. The device includes: one or more fins extending from a substrate, the one or more fins having source/drain epitaxial grown material (S/D epitaxy) thereon; a gate formed over the one or more fins, the gate including high k metal gate (HKMG) disposed between gate spacers; and a metal liner over the S/D epitaxy and sides of the gate spacers. The gate includes a self-aligned contact cap over the HKMG and the metal liner.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4A illustrates a cross-sectional view of the structure of taken along line A-A that is formed after an interlayer dielectric chemical/mechanical planarization and hard mask (SiN) removal (with reactive ion etching) to expose the dummy silicon gate materiel and a second ILD layer has been deposited over the structure;

FIG. 4B illustrates a cross-sectional view of the structure of taken along line B-B that is formed after a second ILD layer has been deposited over the structure;

FIG. 5A illustrates a cross-sectional view of the structure of taken along line A-A that is formed after a partial etch of the sacrificial gate material and the gate spacer has been performed;

FIG. 5B illustrates a cross-sectional view of the structure of taken along line B-B that is formed after a partial etch of the sacrificial gate material and the gate spacer has been performed;

FIG. 6A illustrates a cross-sectional view of the structure of taken along line A-A that is formed after, formed after selective dummy silicon etching using a wet or dry etch process;

FIG. 6B illustrates a cross-sectional view of the structure of taken along line B-B that is formed after, a hot ammonia or tetramethylammonium hydroxide etch has been applied to the structure;

FIG. 7A illustrates a cross-sectional view of the structure of taken along line A-A that is formed after a high-k metal gate (HKMG) has been deposited into the gate trenches;

FIG. 7B illustrates a cross-sectional view of the structure of taken along line B-B that is formed after a high-k metal gate (HKMG) has been deposited into the gate trenches;

FIG. 8A illustrates a cross-sectional view of the structure of taken along line A-A that is formed after a blanket ILD source/drain (S/D) reactive ion etch (RIE) process has been performed on the structure;

FIG. 8B illustrates a cross-sectional view of the structure of taken along line B-B that is formed after a blanket ILD source/drain (S/D) reactive ion etch (RIE) process has been performed on the structure;

FIG. 9A illustrates a cross-sectional view of the structure of taken along line A-A that is formed after performing a highly selective etch to remove the etch stop layer from the structure;

FIG. 9B illustrates a cross-sectional view of the structure of taken along line B-B that is formed after performing a highly selective etch to remove the etch stop layer from the structure;

FIG. 10A illustrates a cross-sectional view of the structure of taken along line A-A that is formed after the etch stop layer has been removed;

FIG. 10B illustrates a cross-sectional view of the structure of taken along line B-B that is formed after the etch stop layer has been removed;

FIG. 11A illustrates a cross-sectional view of the structure of taken along line A-A that is formed after deposition of a source/drain contact metal liner on the structure;

FIG. 11B illustrates a cross-sectional view of the structure of taken along line B-B that is formed after deposition of a metal liner on the structure

FIG. 13A illustrates a cross-sectional view of the structure of taken along line A-A after metal liner cut lithography, patterning, metal liner etch and gate metal etch back;

FIG. 13B illustrates a cross-sectional view of the structure of taken along line B-B after a metal liner cut lithography, patterning, metal liner etch and gate metal etch back;

FIG. 15A illustrates a cross-sectional view of the structure of taken along line A-A after the OPL is removed and metal contacts are formed to provide for S/D contacts; and FIG. 15B illustrates a cross-sectional view of the structure of taken along line B-B after the OPL is removed and metal contacts are formed to provide for S/D contacts.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details. However, certain aspects of the semiconductor device process are explained in more detail at the end of this document.

Turning now to an overview of the aspects of the invention, one or more embodiments of the invention provide a source/drain (S/D) contact opening process that does not negatively affect a previously formed gate. In one embodiment of the invention, this can may be achieved by depositing an etch stop liner (such as a $HfO_2$ layer) over both the dummy gates and the S/D regions after formation of the S/D regions. A contact etch stop layer (CESL) liner is then formed over the etch stop liner. The CESL may also be referred to as an etch stop layer in one embodiment. As will be more fully understood from the below, such a process can allow for the removal of interlayer dielectric (ILD) that is later formed over the S/D regions without harming the gate or the gate spacer. The process may also allow for removal of the CESL without damaging the gate or the gate spacer.

Figure 1:
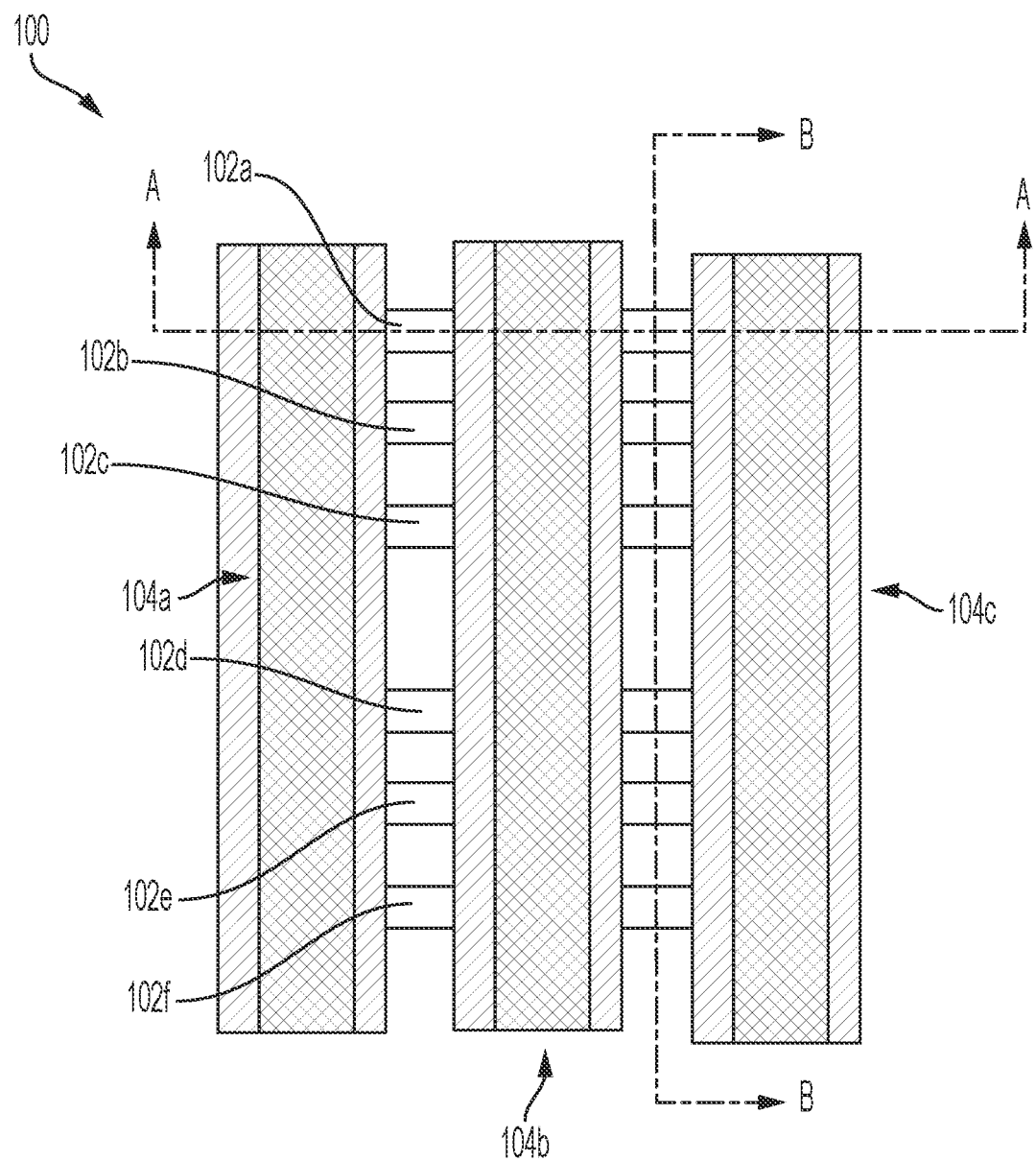
FIG. 1 depicts an overhead view of a structure that includes fins and dummy gates that is used in the process disclosed herein and includes the cross-section indications that distinguishes "A" and "B" figures of the figures that follow FIG. 1.

Turning now to a more detailed description of aspects of the present invention, FIG. 1 depicts a top view of a structure 100 after a plurality (in this case, three) of dummy gates have been formed over the fins formed on a substrate. Several manners in which the fins are formed from a silicon substrate are known and not discussed further herein. The same is true for the dummy gates and related spacers discussed below.

In particular, six fins 102a, 102b, 102c, 102d, 102e and 102f are illustrated but the skilled artisan will realize that the number of fins shown is not limited to six and the teachings herein could be applied to a device that includes any number of fins. For example, a single fin finFET device is contemplated in one embodiment. In some cases, for simplicity, the fins may be collectively referred to by reference numeral 102 without a letter suffix herein. The fins 102a, 102b and 102c can be in first group of fins and the fins 102d, 102e and 102f can be in a second group of fins. The fins in the first group can be part of a first finFET and the fins of the second group can be part of second finFET.

As shown, there are three dummy gates 104a, 104b and 104c shown in FIG. 1. Similar to the fins 102 described above, while three dummy gates are illustrated the skilled artisan will realize that the number of gates shown is not limited three and the teachings herein could be applied to a device that includes any number of gates. For example, the teachings herein could be applied to a single gate finFET device is contemplated in one embodiment. Given the above description, the skilled artisan will also realize that any combination of gates and fins can be formed and used to form a finFET utilizing the teachings herein.

In FIG. 1 there are two cross-section lines shown, line A-A and line B-B. In subsequent figures, figures labelled with an A are cross-sections taken along A-A and those labelled with a B are cross-sections taken along B-B.

Figures 2A, 2B:
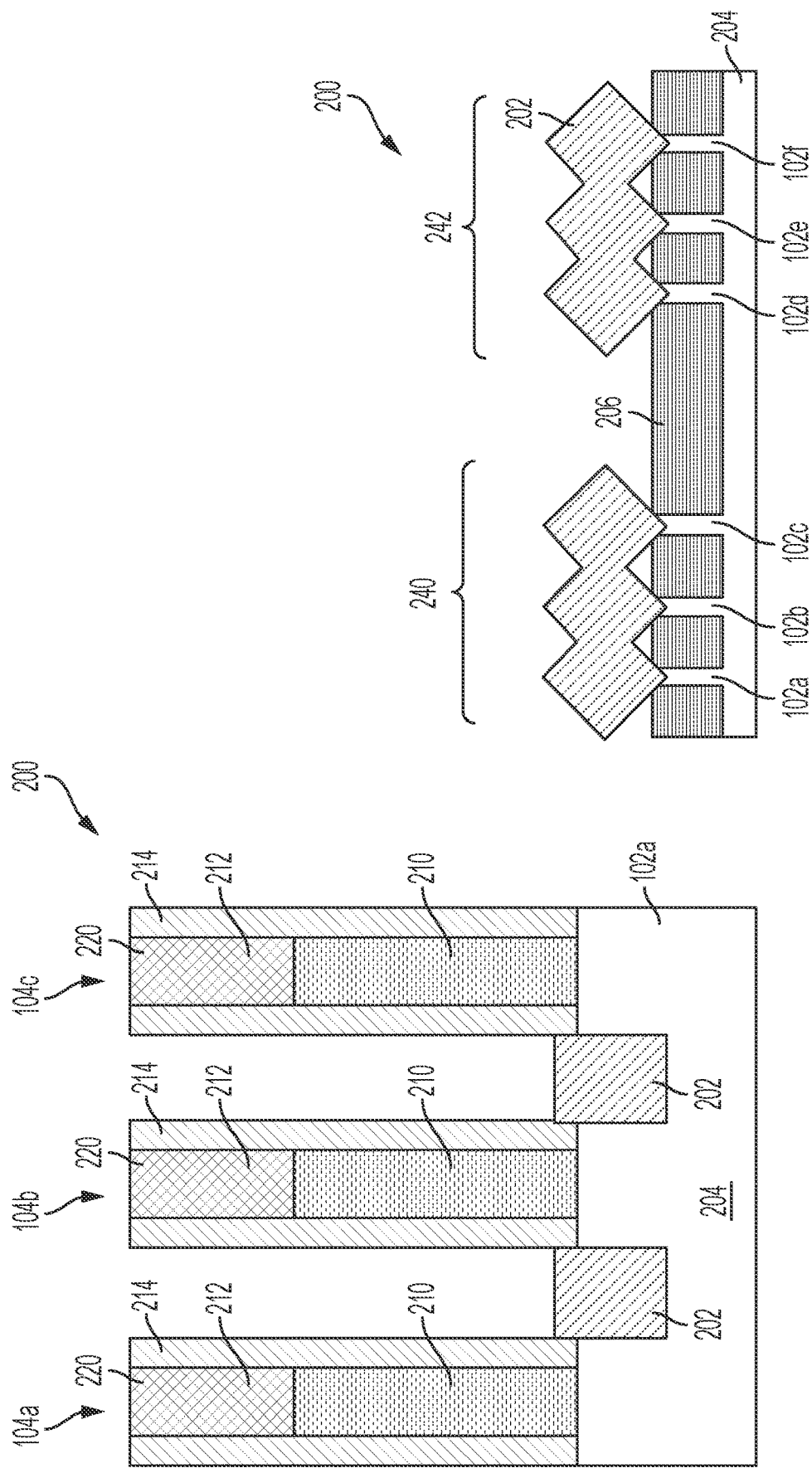
FIG. 2A illustrates a cross-sectional view of the structure taken along line AA, wherein source/drain epitaxy has been epitaxially grown on the fins.
FIG. 2B illustrate a cross-sectional view of the structure taken along line B-B after epitaxial source/drain epitaxy has been grown on the fins.

Turning now to FIGS. 2A and 2B, a structure 200 is illustrated after a material such as silicon or silicon germanium has been grown epitaxially on the fins 102 on FIG. 1. The material is generally denoted by reference numeral 202 and referred to as source/drain (S/D) epitaxy herein. As shown, the S/D epitaxy 202 on each fin 102 contacts the S/D epitaxy 202 on a neighboring fin 102 but that is not required.

As illustrated in FIG. 2B, fins 102a, 102b and 102c form a first group of fins 240 and the fins 102d, 102e and 102f can be in a second group of fins 242. The first group 240 can be part of a first finFET and the second group 242 can be part of a second finFET.

The structure 200 includes a semiconductor substrate 204 with the plurality fins 102 arrayed over the substrate 204. The fins 102 are arranged in parallel and are laterally isolated from each by a shallow trench isolation (STI) layer 206. The fins 102 extend above the STI layer 206. As shown, the portion of the fins 102 extending above the STI layer 206 are covered with the S/D epitaxy 202.

The substrate 204 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 204 is not limited to silicon-containing materials, however, as the substrate 204 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 204 may be a bulk substrate or a composite substrate such as a semiconductor-on-insulator (SOI) substrate that comprises, from bottom to top, a handle portion, an isolation layer (e.g., buried oxide layer), and a semiconductor material layer.

Substrate 204 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The substrate 204 may comprise (100)-oriented silicon or (111)-oriented silicon, for example.

In various embodiments, the fins 102 comprise a semiconductor material such as silicon, and may be formed by patterning and then etching the semiconductor substrate 204, e.g., a top portion of the semiconductor substrate. In several embodiments, the fins 102 are etched from, and therefore contiguous with the semiconductor substrate 204.

In embodiments, the fins 102 can have a width of 5 nm to 20 nm, a height of 40 nm to 150 nm, and a pitch of 20 nm to 100 nm, although other dimensions are also contemplated. The fins 102 may be arrayed on the substrate 204 at a regular intra-fin spacing or pitch. As used herein, the term "pitch" refers to the sum of the fin width and the spacing between neighboring fins. In example embodiments, the fin pitch may be within a range of 20 to 100 nm, e.g., 20, 30, 40, 50, 60, 70, 80, 90 or 100 nm, including ranges between any of the foregoing values, although smaller and larger pitch values may be used.

As illustrated, three dummy gates 104a-104c have been formed over the fin 102a. As illustrated, each dummy gate 104 includes sacrificial gate material 210 covered by a hardmask 212 that can be formed, for example, of silicon nitride (SiN). The sacrificial gate material 210 can be formed of silicon (e.g., amorphous Si, poly-Si).

The dummy gates 104 may be formed by conventional forming methods such as, for example, depositing one or more materials on or over the fin 102 and substrate 204, and a sidewall image transfer patterning process. Both the sacrificial gate material 210 and the hardmask 212 can have their sides covered by a so-called gate spacer 214.

The gate spacer 214 can be formed, for example, by conformally deposition over both the sacrificial gate material 210 and the hardmask 212. The gate spacer 214 can be formed of SiOC, SiOCN, SiC and SiCN. An anisotropic etch back RIE process is used to remove the spacer from the source and drain regions to allow for epitaxy growth or the epitaxy 202.

The term "conformal" (e.g., a conformal layer) means that the thickness of the layer is substantially the same on all surfaces, or that the thickness variation is less than 15% of the nominal thickness of the layer. Similarly, conformal deposition refers to a process where a layer is deposited as a conformal layer.

Figures 3A, 3B:
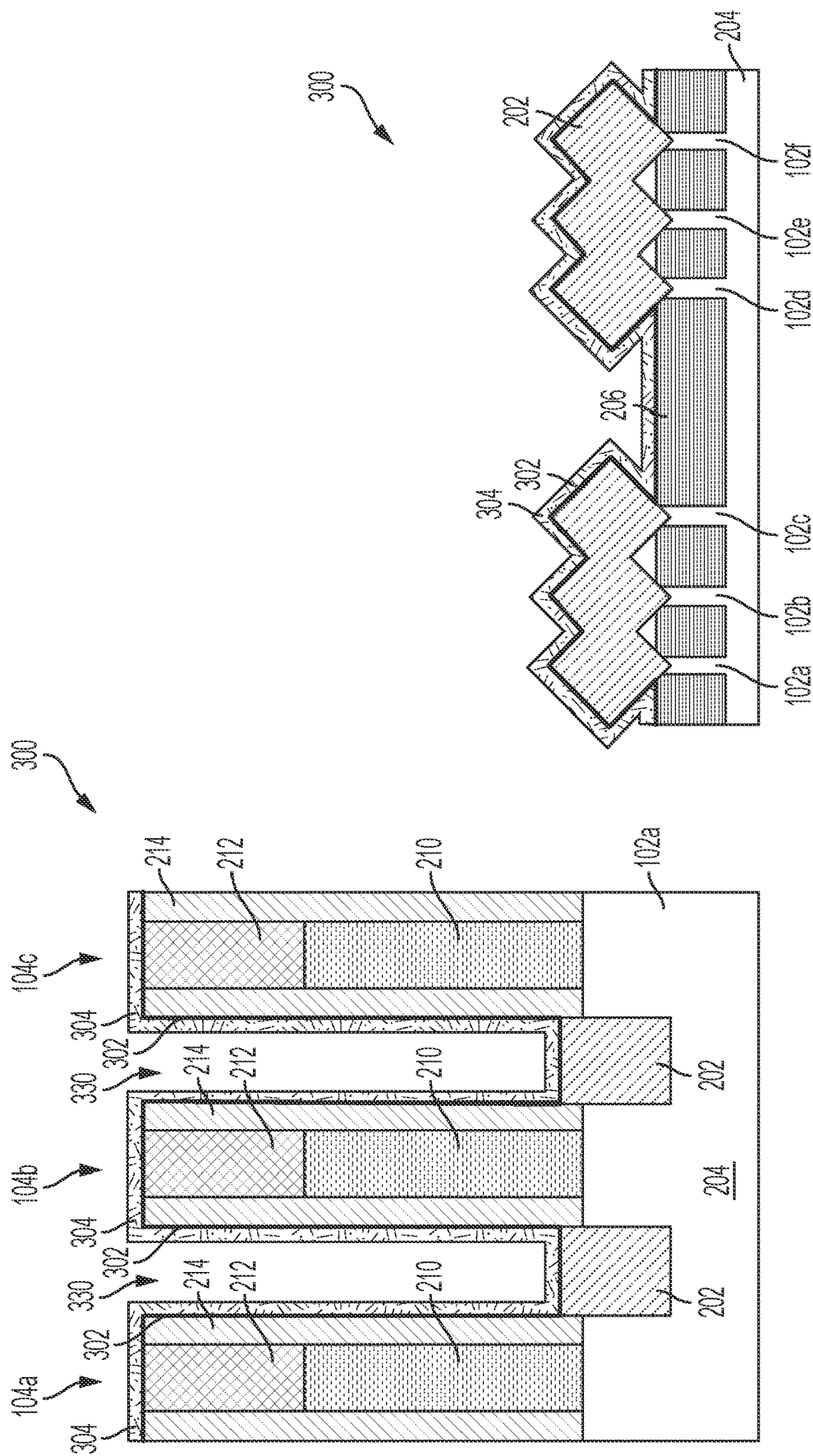
FIG. 3A illustrates a cross-sectional view of the structure of taken along line A-A that is formed after an etch stop liner and an etch stop layer have been deposited over the structure.
FIG. 3B illustrates a cross-sectional view of the structure of taken along line B-B that is formed after an etch stop liner and an etch stop layer have been deposited over the structure.

The skilled artisan will realize that a top 220 of the hardmask 212 can be exposed by a spacer etch back (RIE) process to remove the spacer material from the top 220 and S/D epitaxy 202 to leave the spacer 214 only on the sidewalls of the sacrificial gate material 210. FIGS. 3A and 3B show a structure 300 that is formed after an etch stop liner 302 and a etch stop layer 304 have been deposited over the structure 200 of FIGS. 2A and 2B, respectively. The etch stop liner 302 can be conformally deposited in one embodiment. The etch stop liner 302 can be formed of hafnium dioxide ($HfO_2$) or silicon dioxide ($SiO_2$). In one embodiment, the etch stop liner 302 has a thickness of about 2 nm. The etch stop layer 304 can be formed of SiN.

FIGS. 4A and 4B show a structure 400 that is formed after a second ILD layer 402 (formed of, for example, $SiO_2$) has been deposited. The second ILD layer 402 is formed over the S/D epitaxy 202, the etch stop liner 302 and etch stop layer 304 in the "epi region" that is illustrated in FIG. 4B. The second ILD layer 402 fills the gaps 330 (FIG. 3A) between the dummy gates 104. With reference to FIG. 4A it shall be understood that an oxide an ILD oxide CMP process and SiN hard mask removal (with RIE has also been performed to expose the sacrificial gate material 210 (FIG. 3A). The same process results in the ILD 402 as shown in FIG. 4B being at the same height as in FIG. 4A.

FIGS. 5A and 5B show a structure 500 that is formed after a partial etch of the sacrificial gate material 210 and gate spacer 214 has been performed. The partial etch can be a reactive ion etch (RIE) in one embodiment. The removal of gate material 210 and spacer 214 can be performed in one etch or in two separate etches with one to remove the silicon of the sacrificial gate material 210 and the other to remove the gate spacer 214. Regardless, the resultant structure 500 has a sacrificial gate material 210 with a height that is about the same or is the same as that of the gate spacer 214 and that is less than a height of a top 520 of the second ILD layer 402.

As shown in FIGS. 6A and 6B, a selective etch of silicon can be applied to the structure 500 completely remove the sacrificial gate material 210 to produce the structure 600. The selective etch can be a wet etch of hot ammonia ($NH_4OH$) or tetramethylammonium hydroxide (TMAH) or a dry reactive or chemical etching processes. The resultant structure 600 includes gate recesses 602 bounded by the gate spacer 214 into which a replacement metal gate can be provided.

The etch is selective to remove amorphous or polysilicon and removes a negligible amount of other materials such as the spacer 214, the etch stop liner 302 or the etch stop layer 304.

The resultant structure 600 includes gate trenches 602 bounded by the gate spacer 214 into which a replacement metal gate can be deposited. As will be shown further below, the etch stop liner 302 and the etch stop layer 304 serve to protect the gate spacer 214 and the high-k gate dielectric and metal gate (HKMG) that will fill the recesses 602 during later processing steps.

As shown in FIGS. 7A and 7B, the structure 700 includes a HKMG 702 is deposited into the recesses 602. Such deposition can include conformally a high-k gate dielectric formed of, for example, $ZrO_2$, $HfO_2$, other dielectric metal oxides, alloys thereof, and their silicate alloys. Then a layer of a work function metal (WFM) such as: TiN, TiC, TiAlC, TaN, etc. is deposited and then filling the structure with tungsten (W) that acts as a gate contact. The structure 700 shows the result after the above steps and after a metal CMP process has been performed.

The layer of high-k dielectric is deposited on walls of the spacer 214 in the gate trench 602. This layer (shown as layer 720), in combination with the etch stop liner 302 can serve to completely surround the gate spacer 214.

As shown in FIGS. 8A and 8B, the structure 800 shows the structure 700 after a blanket a source/drain (S/D) contact RIE process has been performed. This process will remove all of the oxide 402 (FIG. 7B) covering the S/D epitaxy 202 and etch stop layer 304.

Such a RIE process can result in a thinning of the etch stop layer 304 as indicated by circle region 802. At this time, the etch stop liner 302, the contact etch stop layer 304 and the HKMG 702 serve to ensure that the RIE does not degrade or otherwise affect the gate spacer 214.

As shown in FIGS. 9A and 9B, structure 900 is the result of the performing a highly selective etch to remove the etch stop layer 304 (e.g. SiN). As will be appreciated, the etch stop liner 302 and the HKMG 702 serve to ensure that the gate spacer 214 is not degraded or otherwise affected.

Next, the etch stop liner 302 (e.g., $HfO_2$) can be removed as shown in FIGS. 10A and 10B (structure 1000) and a contact metal liner 1102 of Ti, Ni or NIPt can be deposited as shown in FIGS. 11A and 11B to form structure 1100.

Figure 12A:
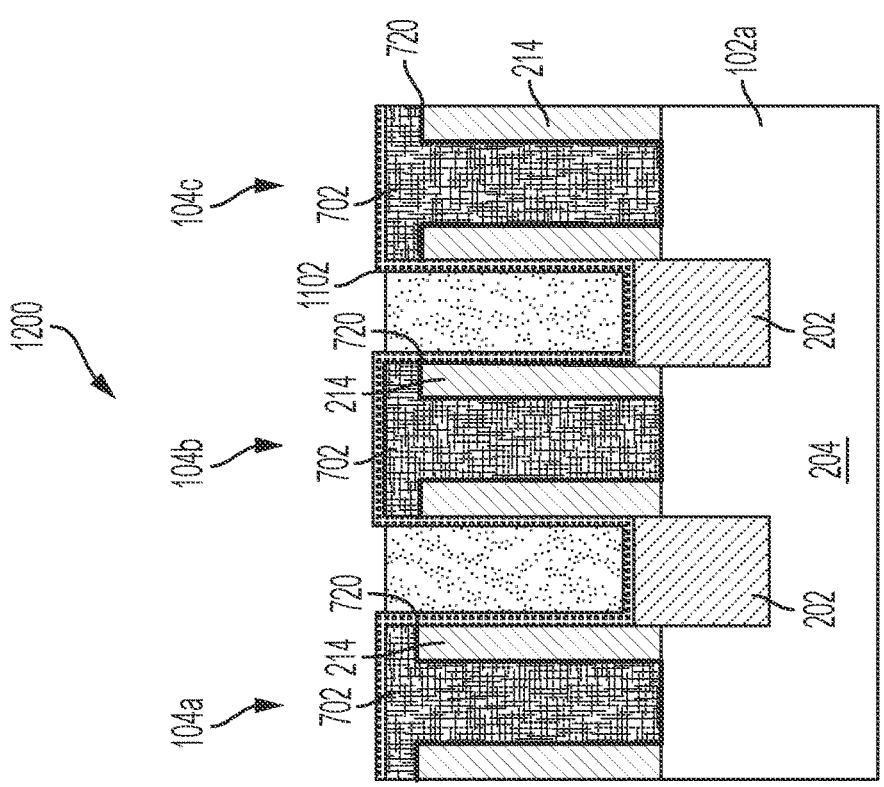
FIG. 12A illustrates a cross-sectional view of the structure of taken along line A-A after an organic planarization layer (OPL) is formed over the metal liner and has been etched back to expose the metal liner.
Figure 12B:
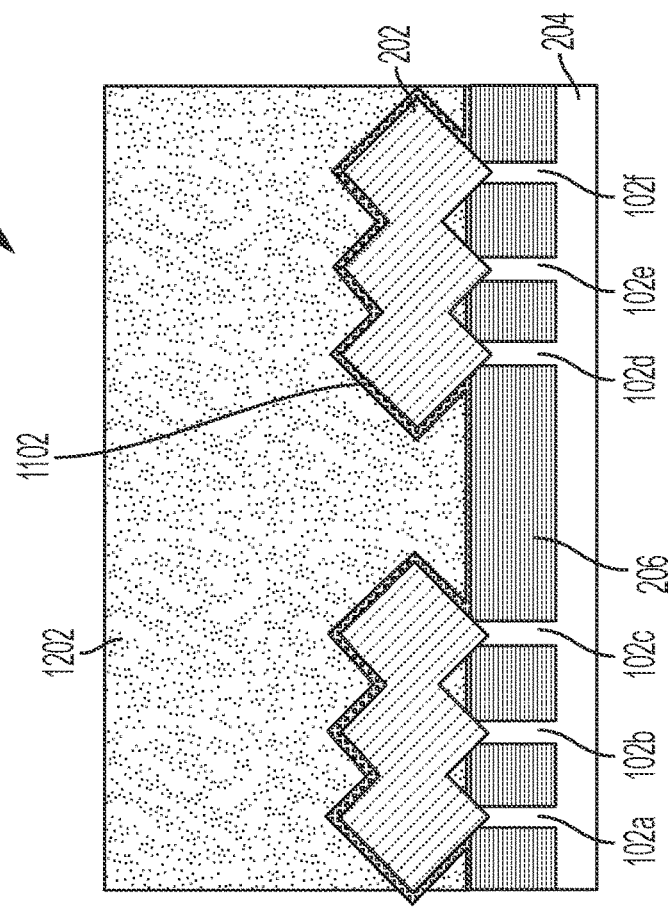
FIG. 12B illustrates a cross-sectional view of the structure of taken along line B-B after an organic planarization layer (OPL) is formed over the metal liner and has been etched back to expose the metal liner.

As shown in FIGS. 12A and 12B, the structure 1200 shows the structure 1100 after an organic planarization layer (OPL) 1200 is formed over the contact metal liner 1102 and has been etched back to expose the contact metal liner 1102 over the HKMG 702. The OPL material forming the OPL layer 1200 may be an organic polymer including C, H, and N. The OPL material can be deposited, for example, by spin coating. A contact metal liner cut pattern opening 1302 to separate adjacent fin groups is the formed through the OPL 1200 as shown in FIGS. 13A and 13B. The opening 1302 can be formed by "metal liner cut" lithography and patterning process that includes an "ARC"—anti-reflective coating and photoresist on the OPL 1200, exposing and developing the cut patterning in the resist and RIE patterning transfer into the OPL 1200 to expose the metal liner 1102.

The structure 1300 shows the structure 1200 after the metal liner 1102 is removed and the gate metal 702 has been recessed. This can be completed by utilizing an etch process that selectively removes metal over dielectrics. The skilled artisan will realize that the high-k dielectric layer 720 remains on sides of the spacer 214. Further, the opening 1302 serves as a region into which a separating material can be deposited to separate S/D metal contacts that are formed later. This opening will remove the metal liner next to fins 102c/102d as indicated by arrow 1320. In this manner, the first ILD layer 206 is exposed.

Figure 14B:
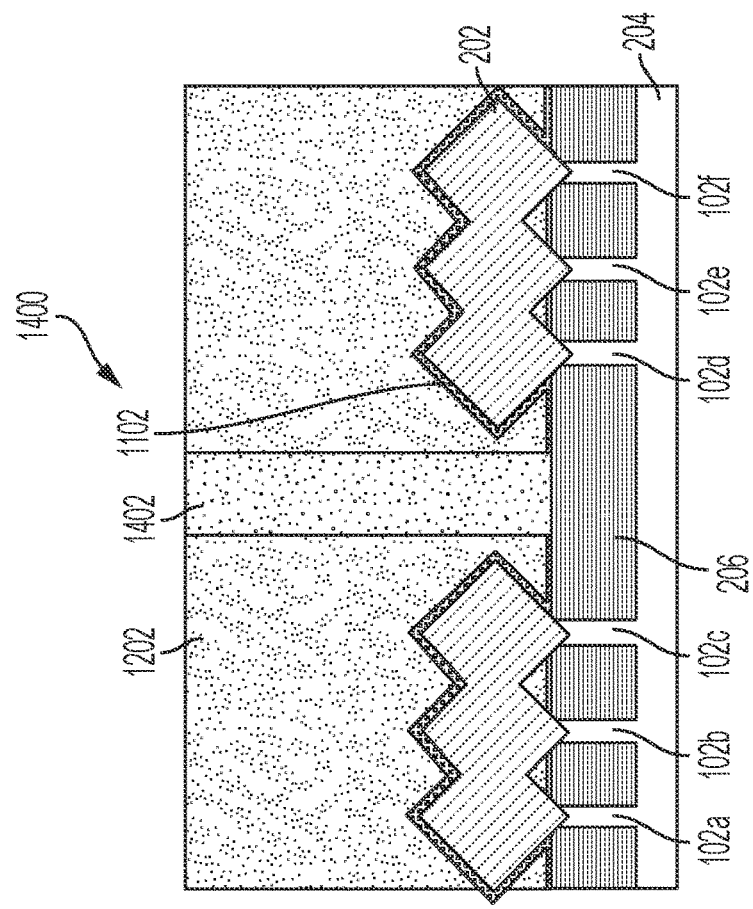
FIG. 14B illustrates a cross-sectional view of the structure of taken along line B-B after a layer of silicon nitride (SiN) is deposited to fill the contact metal liner cut opening.
Figure 14A:
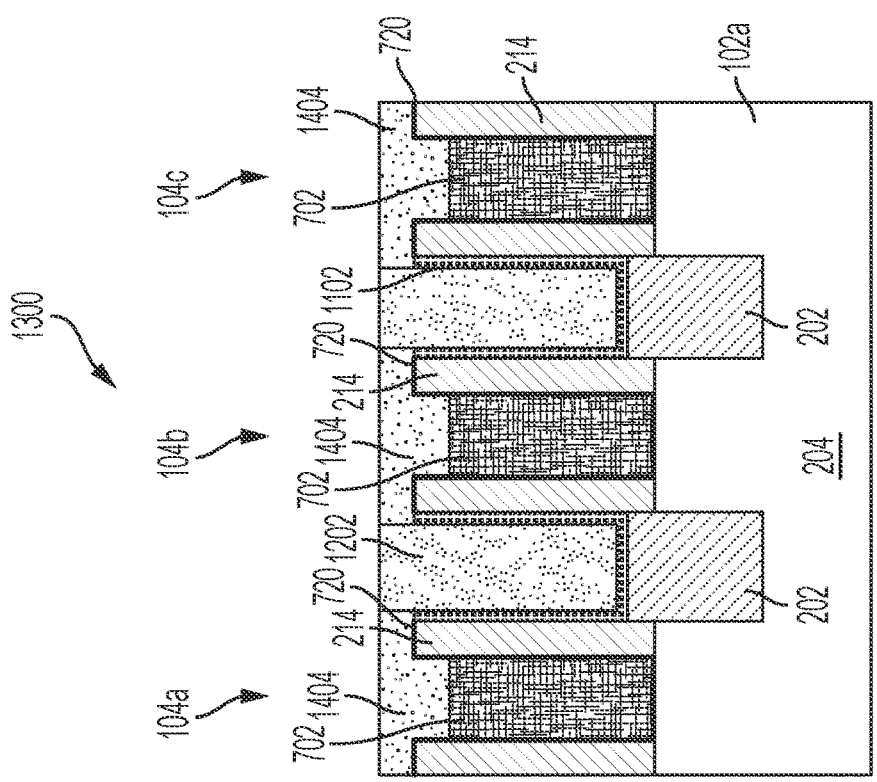
FIG. 14A illustrates a cross-sectional view of the structure of taken along line A-A after a layer of silicon nitride (SiN) is deposited to fill the contact metal liner cut opening.

As shown in FIGS. 14A and 14B, a layer of SiN is then deposited to fill the contact metal liner cut pattern opening 1302 and to cover the recess gate portions. The layer of SiN can be deposited by a plasma enhanced atomic level deposition process in one embodiment.

Herein, the SiN in the contact metal liner cut pattern opening 1302 is referred to as S/D contact spacer 1402 and the SiN over the HKMG 702 is referred to as self-aligned contact (SAC) cap 1404. It will be appreciated that by following some or all of the processes previously described related to the SAC cap 1404 will cover the spacer 214 and the metal liner 1102.

After deposition of the S/D contact spacer 1402 the SiN is etched back and the OPL 1200 can be removed and metal contacts 1502 are formed to provide for S/D contacts as shown by structure 1500 in FIGS. 15A and 15B. The OPL 1200 can be removed by an ash etch in one embodiment.

Further, while not shown a gate contact can be formed through the SAC cap 1404 after RIE in one embodiment. As previously noted herein, for the sake of brevity, conventional techniques related to semiconductor device and integrated circuit (IC) fabrication may or may not have been described in detail above. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process (also referred to as "epi" herein), the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces. Herein, an epi process can be used to form the so called "S/D epitaxy" on exposed substrate fins as part of formation of S/D contacts.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
    one or more fins extending from a substrate, the one or more fins having source/drain epitaxial grown material (S/D epitaxy) thereon;
    a gate formed over the one or more fins, the gate including high k metal gate (HKMG) disposed between gate spacers, wherein the HKMG includes a high-k gate dielectric and metal gate contact; and
    a contact metal liner directly contacting the S/D epitaxy and sides of the gate spacers;
    wherein the gate includes a self-aligned contact cap over the HKMG and the contact metal liner;
    wherein the high-k gate dielectric and the contact metal liner separate the self-aligned contact cap from at least one of the gate spacers.

2. The semiconductor device of claim 1, wherein the metal liner is separated from the HKMG by the gate spacers.

3. The semiconductor device of claim 1, wherein the metal gate contact is formed of tungsten.

4. The semiconductor device of claim 1, wherein a work function metal is disposed between the metal gate contact and the high-k gate dielectric.

* * * * *